(12) United States Patent
Son et al.

(10) Patent No.: US 11,537,243 B2
(45) Date of Patent: Dec. 27, 2022

(54) TOUCH SENSOR MODULE INCLUDING SENSING ELECTRODE AND INSULATION STRUCTURE, WINDOW STACK STRUCTURE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Dong Jin Son, Chungcheongnam-do (KR); Duck Kyeom Kim, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 286 days.

(21) Appl. No.: 16/944,419

(22) Filed: Jul. 31, 2020

(65) Prior Publication Data

US 2021/0048918 A1 Feb. 18, 2021

(30) Foreign Application Priority Data

Aug. 16, 2019 (KR) .......................... 10-2019-0100066

(51) Int. Cl.
*G06F 3/044* (2006.01)
*H05K 1/18* (2006.01)
*H01L 23/538* (2006.01)

(52) U.S. Cl.
CPC .............. *G06F 3/044* (2013.01); *H05K 1/189* (2013.01); *G06F 2203/04102* (2013.01); *H01L 23/5383* (2013.01)

(58) Field of Classification Search
None
See application file for complete search history.

(56) References Cited

U.S. PATENT DOCUMENTS

| | | | |
|---|---|---|---|
| 2010/0075720 A1* | 3/2010 | Lee | G06F 1/1626 345/173 |
| 2016/0147361 A1* | 5/2016 | Ahn | G06F 3/041 345/173 |
| 2017/0090661 A1* | 3/2017 | Kim | H01L 27/323 |
| 2017/0262109 A1* | 9/2017 | Choi | H01L 27/3258 |
| 2019/0340959 A1* | 11/2019 | Park | H01L 27/322 |
| 2020/0053879 A1* | 2/2020 | Suto | H05K 1/028 |
| 2020/0089347 A1* | 3/2020 | Baek | G06F 3/0446 |

\* cited by examiner

*Primary Examiner* — Chad M Dicke
(74) *Attorney, Agent, or Firm* — The PL Law Group, PLLC

(57) ABSTRACT

A touch sensor module includes a touch sensor layer including a visual area, a bending area and a pad area, a flexible circuit board electrically connected to the touch sensor layer on the pad area of the touch sensor layer, a supporting structure partially covering the flexible circuit board and the touch sensor layer, an optical layer disposed on the visual area of the touch sensor layer, the optical layer being spaced apart from the supporting structure in a horizontal direction such that a gap is formed between the optical layer and the supporting structure, a filling layer at least partially filling the gap, and an adhesive layer formed on a bottom surface of a portion of the touch sensor layer in the visual area.

15 Claims, 5 Drawing Sheets

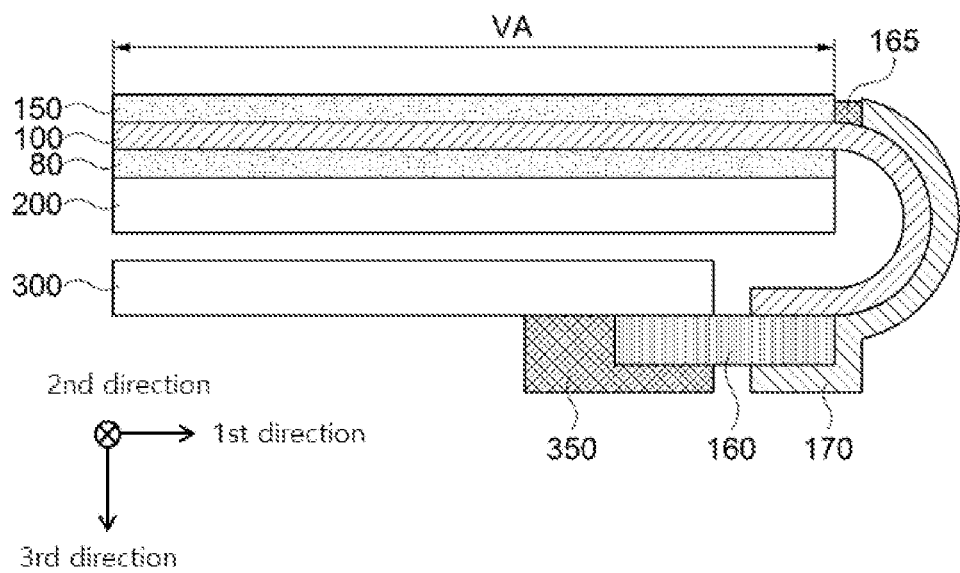

TOUCH SENSOR MODULE INCLUDING SENSING ELECTRODE AND INSULATION STRUCTURE, WINDOW STACK STRUCTURE INCLUDING THE SAME AND IMAGE DISPLAY DEVICE INCLUDING THE SAME

CROSS-REFERENCE TO RELATED APPLICATION AND CLAIM OF PRIORITY

This application claims priority to Korean Patent Applications No. 10-2019-0100066 filed on Aug. 16, 2019 in the Korean Intellectual Property Office (KIPO), the entire disclosure of which is incorporated by reference herein.

BACKGROUND

1. Field

The present invention relates to a touch sensor module, a window stack structure including the same and an image display device including the same. More particularly, the present invention related to a touch sensor module including a sensing electrode and an insulation structure, a window stack structure including the same and an image display device including the same

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

As a flexible display capable of being bent or folded is being developed, the touch sensor having proper properties, structures and constructions for being applied to the flexible display is also needed. Additionally, a proper locational and structural design of the touch sensor may be required in consideration of a connection reliability with a main board, a circuit board, etc., in the image display device.

SUMMARY

According to an aspect of the present invention, there is provided a touch sensor module having improved electrical and mechanical reliability.

According to an aspect of the present invention, there is provided a window stack structure including a touch sensor module having improved electrical and mechanical reliability.

According to an aspect of the present invention, there is provided an image display device including a touch sensor module having improved electrical and mechanical reliability.

The above one or more aspects of the present invention will be achieved by one or more of the following features or constructions:

(1) A touch sensor module includes: a touch sensor layer including a visual area, a bending area and a pad area; a flexible circuit board electrically connected to the touch sensor layer on the pad area of the touch sensor layer; a supporting structure partially covering the flexible circuit board and the touch sensor layer; an optical layer disposed on the visual area of the touch sensor layer to be spaced apart from the supporting structure in a horizontal direction such that a gap is formed between the optical layer and the supporting structure; a filling layer at least partially filling the gap; and an adhesive layer formed on a bottom surface of a portion of the touch sensor layer in the visual area.

(2) The touch sensor module according to the above (1), wherein a top surface of the filling layer is lower than top surfaces of the optical layer and the supporting structure.

(3) The touch sensor module according to the above (1), wherein the filling layer partially covers a top surface of the supporting structure, and a top surface of the filling layer is lower than a top surface of the optical layer.

(4) The touch sensor module according to the above (1), wherein the touch sensor layer includes: sensing electrodes arranged on the visual area; and traces branched from the sensing electrodes to extend to the bending area and the pad area.

(5) The touch sensor module according to the above (4), wherein end portions of the traces are electrically connected to the flexible circuit board on the pad area.

(6) The touch sensor module according to the above (1), wherein the supporting structure partially covers the bending area of the touch sensor layer.

(7) The touch sensor module according to the above (6), wherein the filling layer covers a remaining portion of the bending area.

(8) The touch sensor module according to the above (1), wherein the supporting structure includes a substrate layer and a supporting layer formed on the substrate layer, wherein the supporting layer includes an adhesive material, and the supporting layer is in contact with the flexible circuit board and the touch sensor layer.

(9) The touch sensor module according to the above (1), wherein the filling layer includes an adhesive resin.

(10) The touch sensor module according to the above (1), further comprising a lower supporting structure formed on a bottom surface of a portion of the touch sensor layer in the bending area.

(11) The touch sensor module according to the above (10), wherein the lower supporting structure includes a lower substrate layer, and a lower supporting layer formed on the lower substrate layer and combined with the bottom surface of the touch sensor layer, and the lower supporting layer includes an adhesive material.

(12) The touch sensor module according to the above (11), wherein the lower substrate layer has a modulus greater than that of the lower supporting layer.

(13) The touch sensor module according to the above (1), wherein the optical layer includes at least one selected from a group consisting of a polarizing plate, a polarizer, a retardation film, a reflective sheet, a luminance enhancing film and a refractive index matching film.

(14) A window stack structure, comprising: a window substrate; and the touch sensor module according to embodiments as described above on a surface of the window substrate.

(15) An image display device, comprising: the touch sensor module according to embodiments as described above; and a display panel combined with the touch sensor layer by the adhesive layer of the touch sensor module.

(16) The image display device according to the above (15), further comprising a main board under the display panel, wherein the touch sensor layer and the flexible circuit board of the touch sensor module are bent at the bending area together with the supporting structure to be electrically connected to the main board.

A touch sensor module according to embodiments of the present invention may include a supporting structure partially covering a touch sensor layer and a flexible printed circuit board. When the touch sensor module is folded or bent, delamination of the flexible printed circuit board may be prevented by the supporting structure and damages to sensing electrodes or traces in a bending area may be also prevented.

In some embodiments, the touch sensor module may further include an optical film disposed on the touch sensor layer. A gap may be formed between the supporting structure and the optical film, and a filling layer filling the gap may be formed. The filling layer may further improve a bonding strength or an adhesion of the supporting structure, and additionally block defects such as cracks in the bending area.

In some embodiments, an adhesive layer may be selectively formed only under a portion of the touch sensor layer in a visual area such that an additional structure such as a display panel may be combined in the visual area while maintaining flexibility in the bending area The touch sensor module may be fabricated as a substrate-less type thin film and may be effectively applied to an image display device such as a flexible display.

BRIEF DESCRIPTION OF THE DRAWINGS

FIG. 8 is a schematic cross-sectional view illustrating an image display device combined with a touch sensor module in accordance with exemplary embodiments.

DETAILED DESCRIPTION OF THE EMBODIMENTS

According to exemplary embodiments of the present invention, there is provided a touch sensor module including a touch sensor layer, an optical layer, a flexible circuit board and an adhesive structure and having improved mechanical and electrical stability.

According to exemplary embodiments of the present invention, a window stack structure and an image display device including the touch sensor module is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, for example, two directions being parallel to a top surface of a touch sensor layer and perpendicular to each other are defined as a first direction and a second direction. For example, the first direction may correspond to a length direction of the touch sensor module, and the second direction may correspond to a width direction of the touch sensor module. Additionally, a direction vertical to the first and second directions may be defined as a third direction. For example, the third direction may correspond to a thickness direction of the touch sensor module.

Figure 1:
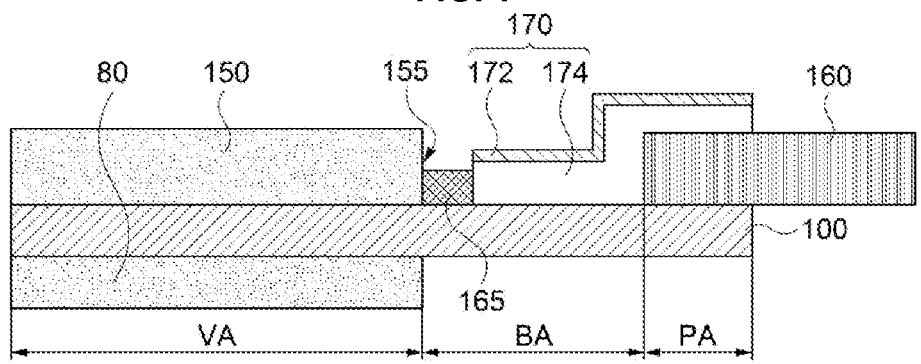
FIG. 1 is a schematic cross-sectional view illustrating a touch sensor module in accordance with exemplary embodiments.

FIG. 1 is a schematic cross-sectional view illustrating a touch sensor module in accordance with exemplary embodiments.

Referring to FIG. 1, the touch sensor module may include a touch sensor layer 100, an optical layer 150 and a flexible circuit board 160 disposed on the touch sensor layer 100, and a supporting structure 170 partially covering the flexible circuit board 160 and the touch sensor layer 100. The touch sensor layer 100 may further include a filling layer 165 formed between the optical layer 150 and the supporting structure 170.

The touch sensor layer 100 may include, e.g., a base insulation layer and sensing electrodes and traces formed on the base insulation layer. Elements and constructions of the touch sensor layer 100 will be described in more detail with reference to FIGS. 2 and 3.

The touch sensor layer 100 or the touch sensor module may include a visual area VA, a bending area BA and a pad area PA. The visual area VA may include a central area of the touch sensor layer 100, and the pad area PA may be positioned at one end portion of the touch sensor layer 100. The bending area BA may be positioned between the visual area VA and the pad area PA.

The visual area VA may include, e.g., a display area of an image display device or an active area where a user's touch may be sensed.

A flexible printed circuit board (FPCB) 160 may be disposed on a portion of the touch sensor layer 100 in the pad area PA, and may be electrically connected to the traces included in the touch sensor layer 100. In an embodiment, a pad portion formed at an end portion of the trace and a circuit wiring included in the flexible circuit board 160 may be electrically connected to each other by a conductive intermediate structure such as an anisotropic conductive film (ACF).

The flexible circuit board 160 may include, e.g., a core layer including a resin or a liquid crystal polymer, and the circuit wiring printed on the core layer. The flexible circuit board 160 may further include a coverlay film covering the circuit wiring. A portion of the coverlay film may be removed to expose a portion of the circuit wiring that may be connected to the pad portion.

The touch sensor layer 100 may further include a passivation layer that may protect the sensing electrode and the traces. In this case, a portion of the passivation layer formed in the pad area PA connected to the flexible circuit board 160 may be removed.

The supporting structure 170 may be formed on or attached to the flexible circuit board 160 on the pad area PA, and may extend to the bending area BA to partially cover the touch sensor layer 100. Accordingly, the supporting structure 170 may commonly and partially cover end portions of the touch sensor layer 100 and the flexible circuit board 160.

The supporting structure 170 may serve as a protective pattern to prevent damages such as delamination, cracks, etc., of the sensing electrodes and the traces caused when the flexible circuit board 160 is detached, folded or bent by an external stress in the bending area BA.

The supporting structure 170 may have a multi-layered structure. For example, the supporting structure 170 may include a substrate layer 172 and a supporting layer 174 formed on a surface of the substrate layer 172. The supporting layer 174 may include, e.g., an acrylic, silicone, urethane, and/or rubber-based adhesive material, and may hold the flexible circuit board 160 and the touch sensor layer 100 commonly in the bending area BA and the pad area PA.

The substrate layer 172 may include a polymer material having a modulus or an elasticity greater than that of the supporting layer 174. For example, the substrate layer 172 may include a polymer film including cyclic olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), polyurethane (PU), cellulose acetate propionate (CAP), polyethersulfone (PES), cellulose triacetate (TAC), polycarbonate (PC), cyclic olefin copolymer (COC), polymethyl methacrylate (PMMA), etc.

For example, the supporting structure 170 may have a tape form including the supporting layer 174 formed by applying the adhesive material on the substrate layer 172.

The touch sensor module may further include the optical layer 150. The optical layer 150 may include a film or a layer structure widely known in the related art for improving an image visibility of an image display device. Non-limiting examples of the optical layer 150 may include a polarizing plate, a polarizer, a retardation film, a reflective sheet, a luminance enhancing film, a refractive index matching film, etc. These may be used alone or in a multi-layered structure.

In exemplary embodiments, the optical layer 150 may be located at substantially the same layer or the same level as that of the supporting structure 170, and may cover the visual area VA of the touch sensor layer 100.

In some embodiments, the optical layer 150 and the supporting structure 170 may be horizontally spaced apart from each other by a predetermined distance on the bending area BA. Accordingly, a gap 155 may be formed between the optical layer 150 and the supporting structure 170. For example, the gap 155 may serve as a margin area for alignment of the supporting structure 170.

In exemplary embodiments, a filling layer 165 filling the gap 155 may be formed. The filling layer 165 may at least partially fill the gap 155, and may contact a top surface of the touch sensor layer 100 and sidewalls of the optical layer 150 and the supporting structure 170.

In some embodiments, a top surface of the filling layer 165 may be lower than each top surface of the optical layer 150 and the supporting structure 170.

The filling layer 165 may be formed by filling an adhesive resin composition in the gap 155 and then curing by a room temperature curing, a thermal curing or an ultraviolet curing. The resin composition may include an acryl-based resin, a silicone-based resin, a urethane-based resin and/or a rubber-based resin. In an embodiment, the resin composition may further include a solvent, a photo-polymerizable monomer, a polymerization initiator, a curing agent, or the like.

As described above, while attaching the supporting structure 170, an alignment margin may be achieved in advance by the gap 155 to prevent a contact with the optical layer 150. Subsequently, the filling layer 165 may be formed by filling the resin composition in the gap 155. Thus, an exposed area of the touch sensor layer 100 may be reduced by the filling layer 165, and the sensing electrodes may be further protected. Additionally, the filling layer 165 may contact and hold the sidewalls of the optical layer 150 and the supporting structure 170 so that peeling and lifting of the supporting structure 170 and the optical layer 150 may be suppressed.

In some embodiments, a viscosity of the filling layer 165 may be from about 1,000 cP to about 5,000 cP at room temperature (25° C.), preferably from about 1,000 cP to about 4,000 cP. The filling layer 165 may substantially fill the gap 155 within the above-mentioned viscosity range to prevent an outflow of the resin material.

In some embodiments, a tensile modulus of the filling layer 165 may be from about 5 MPa to 3,500 MPa, preferably from about 1,000 MPa to 3,500 MPa. Within this tensile modulus range, damages to the sensing electrodes in the bending area of the touch sensor module may be effectively suppressed.

In some embodiments, an adhesion force of the filling layer 165 to a contact surface with the touch sensor layer 100 may be from about 2 N/25 mm or more, and preferably from about 5 N/25 mm or more. In this case, when bending of the touch sensor module occurs, detachments of the filling layer 165 and the electrodes of the touch sensor layer 100 may be sufficiently suppressed.

A thickness of the filling layer 165 may be adjusted to satisfy the above-mentioned ranges of the viscosity, the tensile modulus, and the adhesion force, and may be, e.g., in a range of about 20 μm to about 100 μm.

In some embodiments, an adhesive layer for combining the optical layer 150 may be further formed on the top surface of the touch sensor layer 100 in the visual area VA.

An adhesive layer 80 may be formed on a bottom surface of the touch sensor layer 100 in the visual area VA. In exemplary embodiments, the adhesive layer 80 may be formed in the visual area VA and may not extend to the bending area BA. Accordingly, an additional structure such as a display panel may be combined in the visual area VA while promoting a bending operation in the bending area BA.

Figure 2:
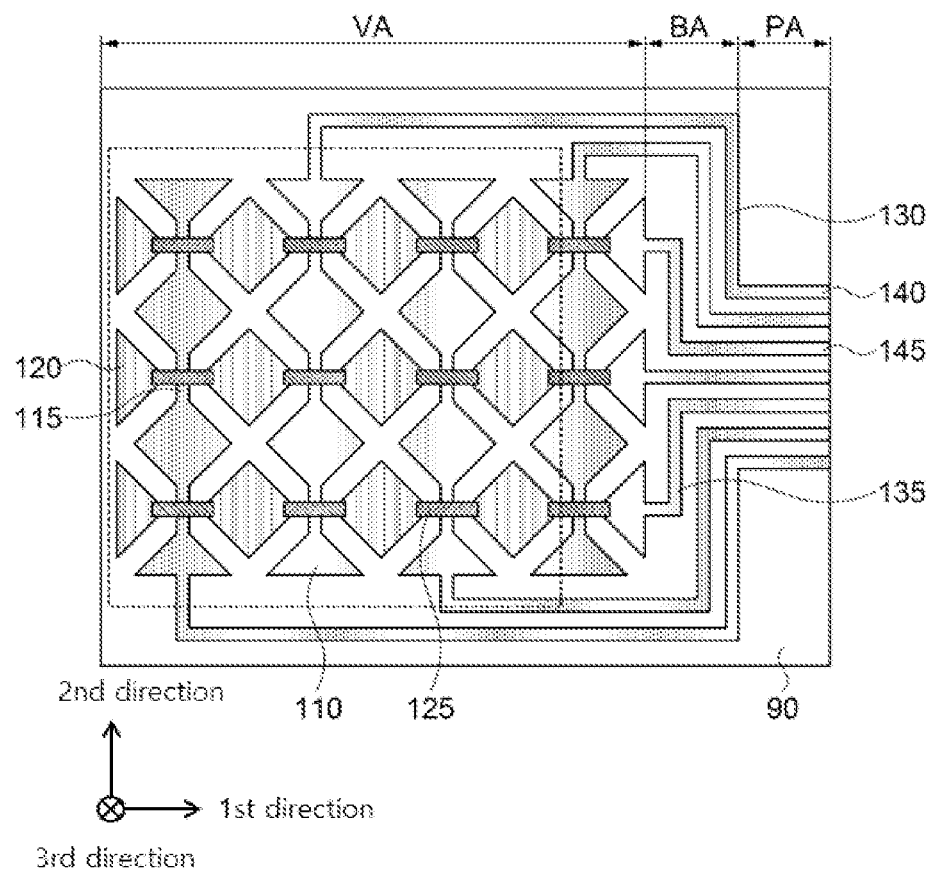
FIGS. 2 and 3 are schematic top planar views illustrating touch sensor layers in accordance with exemplary embodiments.
Figure 3:
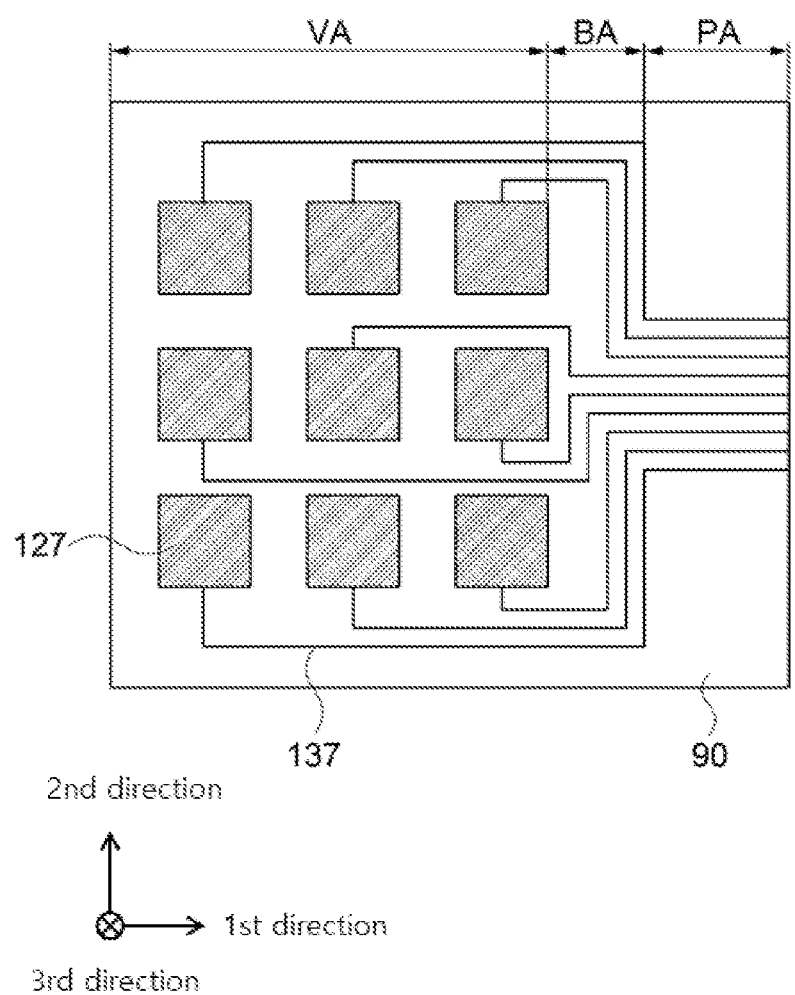

FIGS. 2 and 3 are schematic top planar views illustrating touch sensor layers in accordance with exemplary embodiments.

Referring to FIG. 2, the touch sensor layer 100 may include a base insulation layer 90, and sensing electrodes 110 and 120 and traces 130 and 135 arranged on the base insulation layer 90. In exemplary embodiments, the sensing electrodes 110 and 120 may be arranged to be operable by a mutual capacitance-type. The base insulation layer 90 may serve as a base layer or a supporting layer for forming the sensing electrodes 110 and 120 and the traces 130 and 135.

The sensing electrodes 110 and 120 may be arranged in the visual area VA of the touch sensor layer 100. In exemplary embodiments, the sensing electrodes 110 and 120 may include first sensing electrodes 110 and second sensing electrodes 120.

The first sensing electrodes 110 may be arranged, e.g., along the second direction (e.g., a width direction). Accordingly, a first sensing electrode row extending in the second direction may be formed by a plurality of the first sensing electrodes 110. A plurality of the first sensing electrode rows may be arranged along the first direction.

In some embodiments, the first sensing electrodes 110 neighboring in the second direction may be physically or electrically connected to each other by a connecting portion 115. For example, the connecting portion 115 may be integrally formed with the first sensing electrodes 110 at the same level as that of the first sensing electrodes 110.

The second sensing electrodes 120 may be arranged along the first direction (e.g., a length direction). In some embodiments, the second sensing electrodes 120 may each be physically separated into unit electrodes of an island type. In this case, the second sensing electrodes 120 neighboring in the first direction may be electrically connected to each other by a bridge electrode 125.

A plurality of the second sensing electrodes 120 may be connected to each other by the bridge electrodes 125 and may be arranged in the first direction such that a second sensing electrode column extending in the first direction may be formed. Further, a plurality of the second sensing electrode rows may be arranged along the second direction.

The sensing electrodes 110 and 120 and/or the bridge electrode 125 may include a metal, an alloy or a transparent conductive oxide.

For example, the sensing electrodes 110 and 120 and/or the bridge electrode 125 may be formed of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), tin (Sn), zinc (Zn), molybdenum (Mo), calcium (Ca), or an alloy thereof (e.g., a silver-palladium-copper (APC) alloy or a copper-calcium (CuCa) alloy). These may be used alone or in a combination thereof.

The sensing electrodes 110 and 120 and/or the bridge electrode 125 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 110 and 120 and/or the bridge electrode 125 may have a multi-layered structure including a transparent conductive oxide layer and a metal layer. For example, the sensing electrodes 110 and 120 and/or the bridge electrode 125 may have a triple-layered structure of a transparent conductive oxide layer-metal layer-transparent conductive oxide layer. In this case, flexible properties may be improved and resistance may be reduced by the metal layer while corrosion resistance and transparency may be improved by the transparent conductive oxide layer.

In some embodiments, the bridge electrode 125 may be formed on an insulation layer (not illustrated). The insulation layer may at least partially cover the connecting portion 115 included in the first sensing electrode 110, and at least partially cover the second sensing electrodes 120 around the connecting portion 115. The bridge electrode 125 may penetrate through the insulation layer and may be electrically connected to the second sensing electrodes 120 adjacent to each other with the connecting portion 115 interposed therebetween.

The insulation layer may include an inorganic insulation material such as a silicon oxide or a silicon nitride, or an organic insulation material such as an acrylic resin or a siloxane resin.

The traces 130 and 135 may include a first trace 130 extending from each of the first sensing electrode rows and a second trace 135 extending from each of the second sensing electrode columns.

As illustrated in FIG. 2, the traces 130 and 135 may extend from a periphery of the visual area VA and be collected in the pad area PA via the bending area BA.

For example, the first trace 130 may be branched from each of the first sensing electrode rows from both lateral portions of the touch sensor layer 100 and may extend in the first direction. The first traces 130 may be bent while entering the bending area BA to extend in the second direction. The first traces 130 may be bent again in the first direction to extend in the first direction in the pad area PA.

In some embodiments, the first traces 130 may be alternately distributed on both lateral portions of the touch sensor layer. The first traces 130 may be evenly distributed on both lateral portions of the touch sensor layer so that stress generated during the bending operation as described below may be uniformly dispersed. Additionally, the first traces 130 may be alternately arranged on the both lateral portions so that an alignment margin between the neighboring first traces 130 may be increased.

The second traces 135 may each be branched from each second sensing electrode row and may extend in the second direction in the bending area BA. The second traces 135 may be bent again in the first direction to extend in the first direction to the pad area PA.

End portions of the traces 130 and 135 may serve as pad portions that may be collected in the pad area PA and electrically connected to the flexible circuit board 160. A first pad portion 140 and a second pad portion 145 may be defined by end portions of the first trace 130 and the second trace 135, respectively, and may be disposed in the pad area PA.

The traces 130 and 135 may include a conductive material substantially the same as or similar to that of the sensing electrodes 110 and 120.

In exemplary embodiments, the flexible circuit board 160 may be electrically connected to the pad portions 140 and 145 on the pad area PA. In some embodiments, the conductive intermediate structure such as an anisotropic conductive film (ACF) may be disposed between the flexible circuit board 160 and the pad portions 140 and 145.

As described with reference to FIG. 1, the supporting structure 170 may commonly cover the bending area BA and the pad area PA in a planar view. An adhesion between the flexible circuit board 160 and the touch sensor layer 100 may be enhanced by the supporting structure 170, so that mechanical failures such as detachment of the flexible circuit board 160 and/or the traces 130 and 135 may be prevented.

As described above, the supporting structure 170 may partially cover the bending area BA, and the gap 155 may be formed between the optical layer 150 and the supporting structure 170. For example, the filling layer 165 may fill a remaining area of the bending area BA.

The support structure 170 may be disposed on the bending area BA to cover portions of the traces 130 and 135, so that mechanical defects such as fracture or peel-off of the traces 130 and 135 may be suppressed when folding or bending occurs. Additionally, the filling layer 165 may fill the remaining area of the bending area BA so that mechanical stability of the traces 130 and 135 may be further improved.

Referring to FIG. 3, sensing electrodes 127 and traces 137 of the touch sensor layer may be arranged to be operable in a self-capacitance type.

The touch sensor layer may include the sensing electrodes 127 each of which may be provided as an independent island pattern. Additionally, the traces 137 may be branched from each sensing electrode 127 to extend to the pad area PA. End portions of the traces 137 may be collected in the pad area PA and may be electrically connected to the flexible circuit board 160.

As described above, the supporting structure 170 may commonly cover the touch sensor layer 100 and the flexible circuit board 160 on the pad area PA and the bending area BA. Additionally, the remaining portion of the bending area BA may be filled with the filling layer 165 as described above.

Figure 4:
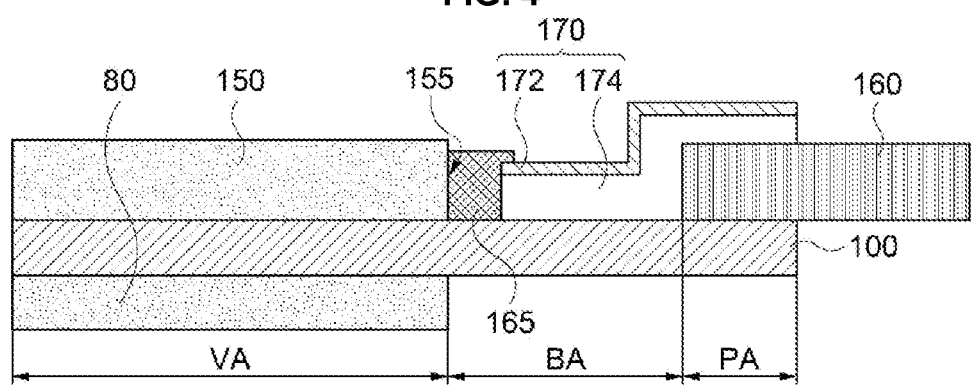
FIGS. 4 to 6 are schematic cross-sectional views illustrating touch sensor modules in accordance with some exemplary embodiments.
Figure 5:
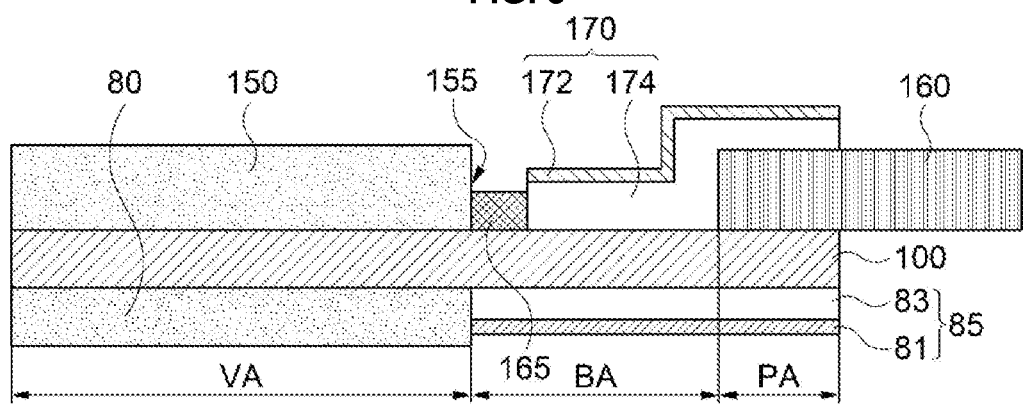
Figure 6:
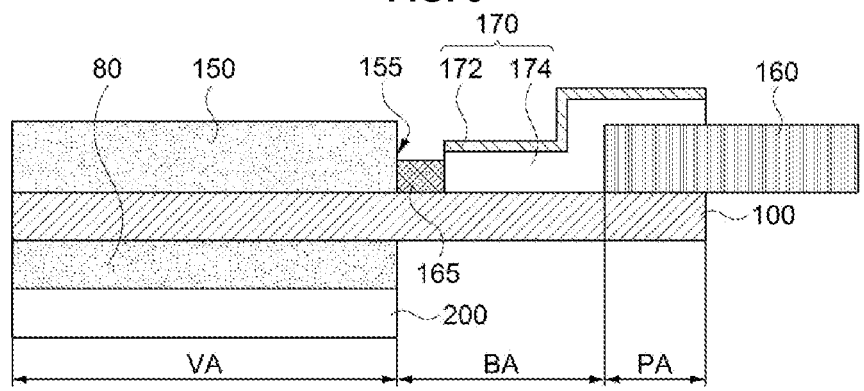

FIGS. 4 to 6 are schematic cross-sectional view illustrating touch sensor modules in accordance with some exemplary embodiments. Detailed descriptions on elements and/or structures substantially the same as or similar to those as described with reference to FIG. 1 are be omitted herein.

Referring to FIG. 4, the filling layer 165 may fill the gap 155 and may also partially cover a top surface of the supporting structure 170. Accordingly, the supporting structure 170 may be more stably fixed when bending the flexible circuit board 160 and the touch sensor layer 100.

A top surface of the filling layer 165 may be lower than that of the optical layer 150. Accordingly, the filling layer 165 may not cover the top surface of the optical layer 150 to prevent properties of the optical layer 150 from being disturbed by the filling layer 165.

Referring to FIG. 5, a lower supporting structure 85 may be combined with a bottom surface of the touch sensor layer 100 in the bending area BA and the pad area PA In some embodiments, the lower supporting structure 85 may have a structure and a configuration substantially the same or similar to those of the supporting structure 170. For example, the lower supporting structure 85 may include a lower substrate layer 81 and a lower supporting layer 83 including an adhesive material, and the lower supporting layer 83 may be attached to the bottom surface of the touch sensor layer 100.

The adhesive layer 80 may be formed on the bottom surface of the touch sensor layer 100 in the visual area VA, and the lower supporting structure 85 may be formed on the bottom surface in the bending area BA. Thus, bending stability may be obtained by the lower substrate layer 81 having a relatively improved modulus, and an additional structure such as a display panel may be combined by the adhesive layer 80.

Referring to FIG. 6, as described above, the touch sensor module may be combined with a display panel 200 by the adhesive layer 80 in the visual area VA.

In some embodiments, as described with reference to FIG. 5, the lower supporting structure 85 may be combined under the touch sensor layer 100 in the bending area BA and the pad area PA.

Figure 7:
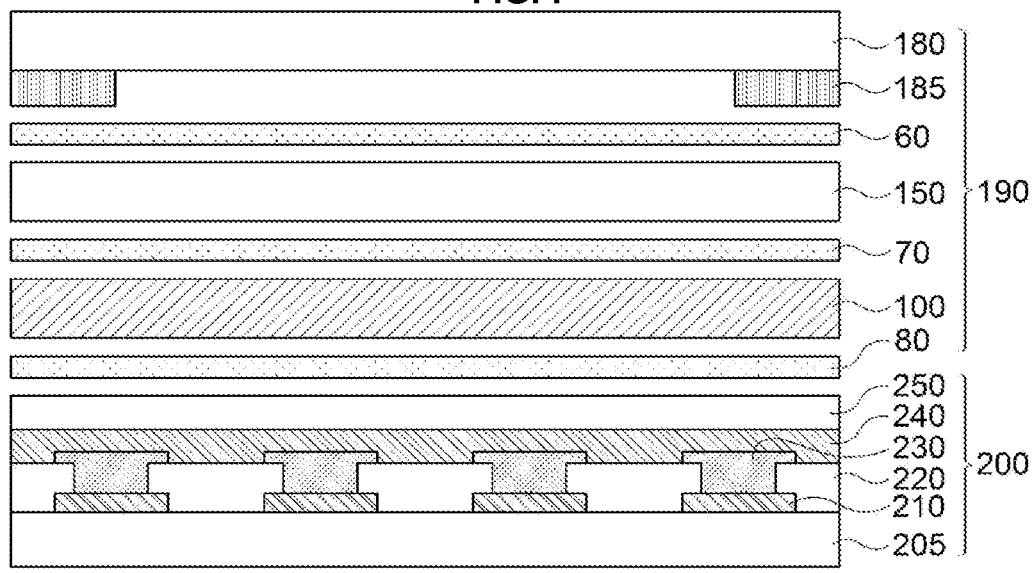
FIG. 7 is a schematic view illustrating a window stack structure and an image display device in accordance with exemplary embodiments.

FIG. 7 is a schematic view illustrating a window stack structure and an image display device in accordance with exemplary embodiments.

Referring to FIG. 7, a window stack structure 190 may include a window substrate 180 and a touch sensor module according to exemplary embodiments described above. The touch sensor module may include, e.g., the touch sensor layer 100 and the optical layer 150 stacked on the visual area VA of the touch sensor layer 100 as described with reference to FIGS. 1 to 6. For convenience of descriptions, illustration of the supporting structure 170 and the flexible circuit board 160 are omitted in FIG. 7 and will be described in more detail with reference to FIG. 8.

The window substrate 180 may include, e.g., a hard coating film or a thin or ultra-thin glass (e.g., ultra-thin glass (UTG)). In an embodiment, a light-shielding pattern 185 may be formed on a peripheral portion of one surface of the window substrate 180. The light-shielding pattern 185 may include, e.g., a color-printed pattern, and may have a single-layered or multi-layered structure. A bezel portion or a non-display area of the image display device may be defined by the light-shielding pattern 185.

The optical layer 150 may include various optical films or optical structures included in the image display device. In some embodiments, the optical layer 150 may include a coating-type polarizer or a polarizing plate. The coating-type polarizer may include a liquid crystal coating layer that may include a cross-linkable liquid crystal compound and a dichroic dye. In this case, the optical layer 150 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The optical layer 150 may be directly attached to the surface of the window substrate 180 or may be attached via a first adhesive layer 60.

The touch sensor layer 100 may be included in the window stack structure 190 as a film or a panel. In an embodiment, the touch sensor layer 100 may be combined with the optical layer 150 via a second adhesive layer 70.

As illustrated in FIG. 7, the window substrate 180, the optical layer 150 and the touch sensor layer 100 may be sequentially positioned from a viewer's side. In this case, sensing electrodes of the touch sensor layer 100 may be disposed under the optical layer 150 including the polarizer or the polarizing plate so that electrode patterns may be effectively prevented from being seen by the viewer.

The image display device may include a display panel 200 and the window stack structure 190 disposed on the display panel. The window stack structure 190 may include the touch sensor module according to exemplary embodiments.

The display panel 200 may include a pixel electrode 210, a pixel defining layer 220, a display layer 230, an opposing electrode 240 and an encapsulation layer 250 disposed on a panel substrate 205.

The panel substrate 205 may include a flexible resin material. In this case, the image display device may be a flexible display.

A pixel circuit including a thin film transistor (TFT) may be formed on the panel substrate 205, and insulation layer covering the pixel circuit may be formed. The pixel electrode 210 may be electrically connected to, e.g., a drain electrode of the TFT on the insulation layer.

The pixel defining layer 220 may be formed on the insulation layer, and the pixel electrode 210 may be exposed through the pixel defining layer 220 such that a pixel region may be defined. The display layer 230 may be formed on the pixel electrode 210, and the display layer 230 may include, e.g., a liquid crystal layer or an organic light emitting layer.

The opposing electrode 240 may be disposed on the pixel defining layer 220 and the display layer 230. The opposing electrode 240 may serve as, e.g., a common electrode or a cathode of the image display device. The encapsulation layer 250 may be disposed on the opposing electrode 240 to protect the display panel 200.

As described with reference to FIG. 6, the display panel 200 may be combined with the touch sensor layer 100 through the adhesive layer 80. For example, a thickness of the adhesive layer 80 may be greater than each thickness of the first and second adhesive layers 60 and 70. A viscoelasticity of the adhesive layer 80 may be about 0.2 MPa or less at a temperature ranging from −20° C. to 80° C. In this case, a noise from the display panel 200 may be blocked, and an interface stress while being bent may be alleviated so that damages of the window stack structure 190 may be avoided. In an embodiment, the viscoelasticity of the adhesive layer 80 may be in a range from about 0.01 MPa to about 0.15 MPa.

FIG. 8 is a schematic cross-sectional view illustrating an image display device combined with a touch sensor module in accordance with exemplary embodiments. For example, FIG. 8 illustrates a driving circuit connection of a touch sensor module via a flexible circuit board.

Referring to FIG. 8, the image display device includes the display panel 200 and a main board 300, and may include a touch sensor module according to exemplary embodiments as described above. The touch sensor module may include the touch sensor layer 100 and the optical layer 150 disposed on the visual area VA of the touch sensor layer 100.

As described with reference to FIG. 1, bending may be initiated from the bending area BA of the touch sensor layer 100 and the bending may occur in the third direction (e.g., a thickness direction of the image display device) along the first direction. Accordingly, pad portions of the traces included in the pad area PA may be electrically connected to the main board 300 via the flexible circuit board 160. The flexible circuit board 160 may be connected to, e.g., a bonding pad 350 formed on a bottom surface of the main board 300.

In an embodiment, an end portion (e.g., the pad area PA and/or the bending area BA) of the touch sensor module or the touch sensor layer 100 may be bent by 180 degrees (°) or more. Accordingly, the end portion may extend again in the first direction. The end portion may face a non-bent portion of touch sensor layer 100 portion in the third direction.

As described above, even though drastic bending is applied, the supporting structure 170 may fix a combination between the flexible circuit board 160 and the touch sensor layer 100, thereby suppressing fracture, separation, etc. of circuits, wiring, electrodes, etc. Additionally, the filling layer 165 may be formed between the optical layer 150 and the supporting structure 170 so that mechanical damages such as cracks of the sensing electrodes in a bending initiation area may be prevented.

For example, in the touch sensor module according to exemplary embodiments, cracks of the traces may be prevented even in a bending radius of 0.2R or more. Preferably, mechanical and operational reliability of the traces may be maintained even in a bending radius of 1R or more.

What is claimed is:

1. A touch sensor module, comprising:
    a touch sensor layer including a visual area, a bending area and a pad area;
    a flexible circuit board electrically connected to the touch sensor layer on the pad area of the touch sensor layer;
    a supporting structure partially covering the flexible circuit board and the bending area of the touch sensor layer;
    an optical layer disposed on the visual area of the touch sensor layer, the optical layer being spaced apart from the supporting structure in a horizontal direction such that a gap is formed between the optical layer and the supporting structure;
    a filling layer at least partially filling the gap; and
    an adhesive layer formed on a bottom surface of a portion of the touch sensor layer in the visual area.

2. The touch sensor module according to claim 1, wherein a top surface of the filling layer is lower than top surfaces of the optical layer and the supporting structure.

3. The touch sensor module according to claim 1, wherein the filling layer partially covers a top surface of the supporting structure, and a top surface of the filling layer is lower than a top surface of the optical layer.

4. The touch sensor module according to claim 1, wherein the touch sensor layer includes:
    sensing electrodes arranged on the visual area; and
    traces branched from the sensing electrodes to extend to the bending area and the pad area.

5. The touch sensor module according to claim 4, wherein end portions of the traces are electrically connected to the flexible circuit board on the pad area.

6. The touch sensor module according to claim 1, wherein the filling layer covers a remaining portion of the bending area.

7. The touch sensor module according to claim 1, wherein the supporting structure includes a substrate layer and a supporting layer formed on the substrate layer,
    wherein the supporting layer includes an adhesive material, and the supporting layer is in contact with the flexible circuit board and the touch sensor layer.

8. The touch sensor module according to claim 1, wherein the filling layer includes an adhesive resin.

9. The touch sensor module according to claim 1, further comprising a lower supporting structure formed on a bottom surface of a portion of the touch sensor layer in the bending area.

10. The touch sensor module according to claim 9, wherein the lower supporting structure includes a lower substrate layer, and a lower supporting layer formed on the lower substrate layer and combined with the bottom surface of the touch sensor layer, and the lower supporting layer includes an adhesive material.

11. The touch sensor module according to claim 10, wherein the lower substrate layer has a modulus greater than that of the lower supporting layer.

12. The touch sensor module according to claim 1, wherein the optical layer includes at least one selected from a group consisting of a polarizing plate, a polarizer, a retardation film, a reflective sheet, a luminance enhancing film and a refractive index matching film.

13. A window stack structure, comprising:
    a window substrate; and
    the touch sensor module according to claim 1 on a surface of the window substrate.

14. An image display device, comprising:
    the touch sensor module according to claim 1; and
    a display panel combined with the touch sensor layer by the adhesive layer of the touch sensor module.

15. The image display device according to claim 14, further comprising a main board under the display panel,
    wherein the touch sensor layer and the flexible circuit board of the touch sensor module are bent at the bending area together with the supporting structure to be electrically connected to the main board.

* * * * *